United States Patent
Zhou et al.

(10) Patent No.: US 11,385,553 B2
(45) Date of Patent: Jul. 12, 2022

(54) METROLOGY METHOD, PATTERNING DEVICE, APPARATUS AND COMPUTER PROGRAM

(71) Applicant: ASML Netherlands B.V., Veldhoven (NL)

(72) Inventors: Zili Zhou, Eindhoven (NL); Nitesh Pandey, Eindhoven (NL); Olger Victor Zwier, Eindhoven (NL); Patrick Warnaar, Tilburg (NL); Maurits Van Der Schaar, Eindhoven (NL); Elliott Gerard McNamara, Eindhoven (NL); Arie Jeffrey Den Boef, Waalre (NL); Paul Christiaan Hinnen, Veldhoven (NL); Murat Bozkurt, Uden (NL); Joost Jeroen Ottens, Veldhoven (NL); Kaustuve Bhattacharyya, Veldhoven (NL); Michael Kubis, Meerbusch (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/306,670

(22) Filed: May 3, 2021

(65) Prior Publication Data
US 2021/0255553 A1    Aug. 19, 2021

Related U.S. Application Data

(63) Continuation of application No. 16/594,613, filed on Oct. 7, 2019, now Pat. No. 10,996,570.

(30) Foreign Application Priority Data

Oct. 8, 2018   (EP) .................................... 18199182

(51) Int. Cl.
*G03F 7/20* (2006.01)
*G01N 21/47* (2006.01)
(Continued)

(52) U.S. Cl.
CPC ..... *G03F 7/70633* (2013.01); *G01N 21/4788* (2013.01); *G01N 21/9501* (2013.01);
(Continued)

(58) Field of Classification Search
CPC ........... G01N 21/4788; G01N 21/9501; G01N 21/956; G03F 7/70191; G03F 7/70633;
(Continued)

(56) References Cited

U.S. PATENT DOCUMENTS

| 5,789,124 A | 8/1998 | Todd |
| 6,982,793 B1 | 1/2006 | Yang et al. |

(Continued)

FOREIGN PATENT DOCUMENTS

| JP | 2017-518533 A | 7/2017 |
| JP | 2017-526973 A | 9/2017 |

(Continued)

OTHER PUBLICATIONS

International Search Report and Written Opinion of the International Searching Authority directed to related International Patent Application No. PCT/EP2019/077016, dated Dec. 3, 2019; 12 pages.

(Continued)

*Primary Examiner* — Hung V Nguyen
(74) *Attorney, Agent, or Firm* — Sterne, Kessler, Goldstein & Fox P.L.L.C.

(57) ABSTRACT

A method of measuring overlay uses a plurality of asymmetry measurements from locations (LOI) on a pair of sub-targets (1032, 1034) formed on a substrate (W). For each sub-target, the plurality of asymmetry measurements are fitted to at least one expected relationship (1502, 1504) between asymmetry and overlay, based on a known bias variation deigned into the sub-targets. Continuous bias variation in one example is provided by varying the pitch of (Continued)

top and bottom gratings (P1/P2). Bias variations between the sub-targets of the pair are equal and opposite (P2/P1). Overlay (OV) is calculated based on a relative shift (xs) between the fitted relationships for the two sub-targets. The step of fitting asymmetry measurements to at least one expected relationship includes wholly or partially discounting measurements (1506, 1508, 1510) that deviate from the expected relationship and/or fall outside a particular segment of the fitted relationship.

20 Claims, 12 Drawing Sheets

(51) Int. Cl.
*G01N 21/95* (2006.01)
*G01N 21/956* (2006.01)
*G03F 9/00* (2006.01)

(52) U.S. Cl.
CPC ......... *G01N 21/956* (2013.01); *G03F 7/7085* (2013.01); *G03F 7/70191* (2013.01); *G03F 7/70683* (2013.01); *G03F 9/7007* (2013.01); *G03F 9/7073* (2013.01); *G03F 9/7076* (2013.01)

(58) Field of Classification Search
CPC .. G03F 7/70683; G03F 7/7085; G03F 9/7007; G03F 9/7073; G03F 9/7076
USPC .............................. 355/67, 77; 356/399–401
See application file for complete search history.

(56) References Cited

U.S. PATENT DOCUMENTS

| | | | |
|---|---|---|---|
| 7,046,361 B1 | 5/2006 | Yang et al. | |
| 10,809,628 B2 | 10/2020 | Den Boef et al. | |
| 10,996,570 B2 | 5/2021 | Zhou et al. | |
| 11,204,239 B2 | 12/2021 | Bhattacharyya et al. | |
| 2005/0195398 A1 | 9/2005 | Adel et al. | |
| 2007/0279630 A1 | 12/2007 | Kandel et al. | |
| 2010/0201963 A1 | 8/2010 | Cramer et al. | |
| 2010/0328655 A1 | 12/2010 | Den Boef | |
| 2011/0027704 A1 | 2/2011 | Cramer et al. | |
| 2011/0043791 A1 | 2/2011 | Smilde et al. | |
| 2011/0069292 A1 | 3/2011 | Den Boef | |
| 2011/0102753 A1 | 5/2011 | Van De Kerkhof et al. | |
| 2011/0205518 A1 | 8/2011 | Van De Kerkhof et al. | |
| 2012/0242970 A1 | 9/2012 | Smilde et al. | |
| 2013/0258310 A1 | 10/2013 | Smilde et al. | |
| 2017/0090302 A1* | 3/2017 | Slotboom | G03F 7/70633 |
| 2017/0357154 A1 | 12/2017 | Oh et al. | |
| 2018/0129139 A1 | 5/2018 | Jiang et al. | |
| 2019/0178639 A1 | 6/2019 | Gutman et al. | |
| 2020/0110342 A1 | 4/2020 | Zhou et al. | |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2015/062854 A1 | 5/2015 |
| WO | WO 2015/078669 A1 | 6/2015 |
| WO | WO 2015/090838 A1 | 6/2015 |
| WO | WO 2017/194289 A1 | 11/2017 |
| WO | WO 2018/015179 A1 | 1/2018 |
| WO | WO 2018/206227 A1 | 11/2018 |

OTHER PUBLICATIONS

International Preliminary Report on Patentability directed to related International Patent Application No. PCT/EP2019/077016, dated Apr. 8, 2021; 6 pages.

Non-Final Rejection directed to related U.S. Appl. No. 16/594,613, dated May 27, 2020; 10 pages.

Final Rejection directed to related U.S. Appl. No. 16/594,613, dated Sep. 4, 2020; 9 pages.

Notice of Allowance directed to related U.S. Appl. No. 16/594,613, dated Dec. 22, 2020; 10 pages.

\* cited by examiner

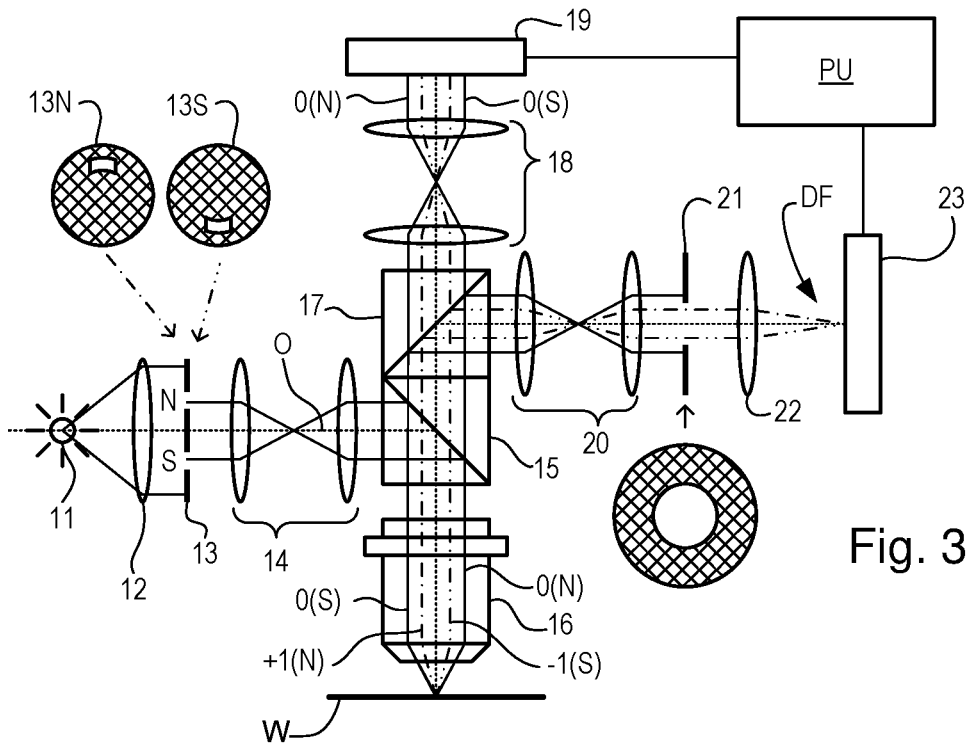
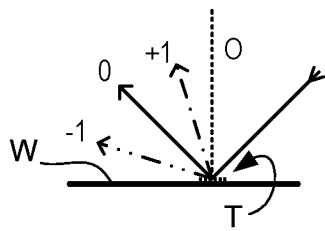 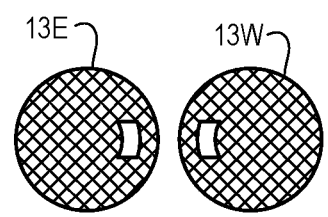 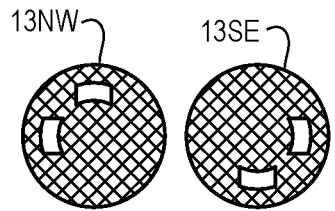
Fig. 3(b)  Fig. 3(c)  Fig. 3(d)
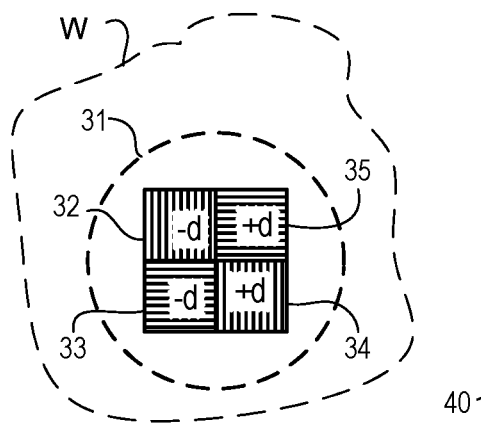 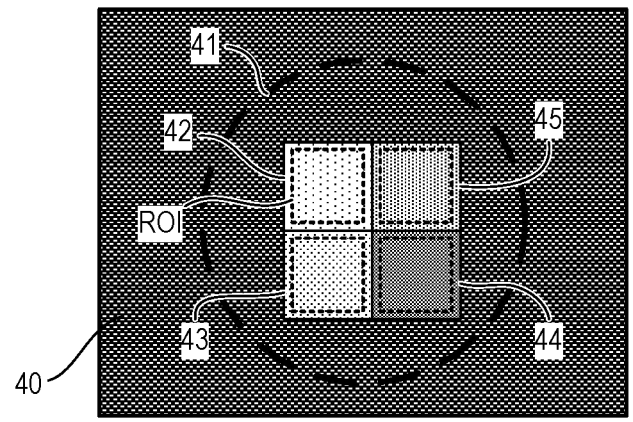
Fig. 4 (Prior art)  Fig. 5 (Prior art)

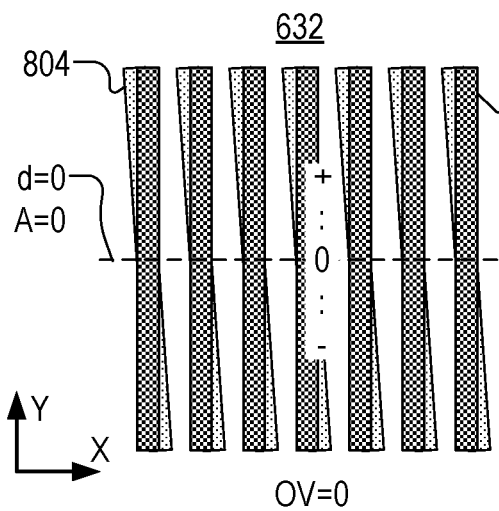
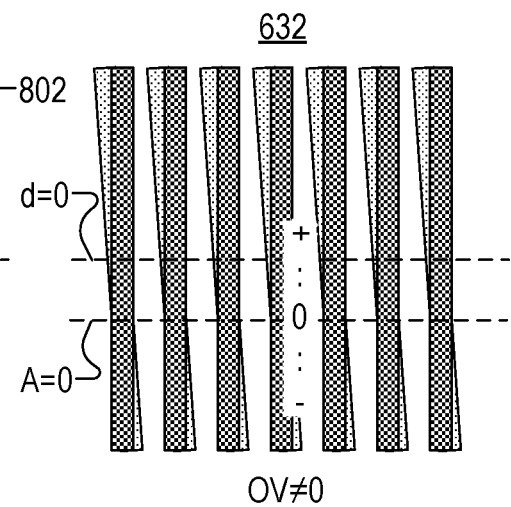
Fig. 8(a) Fig.8(b)
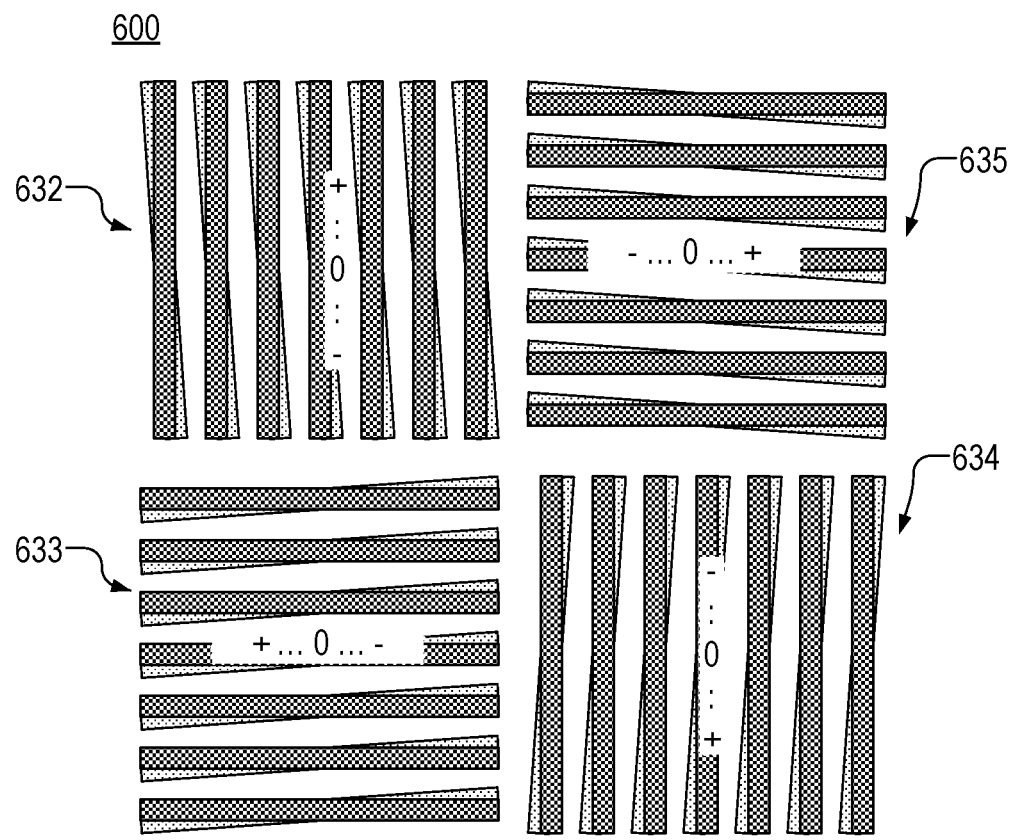
Fig. 9

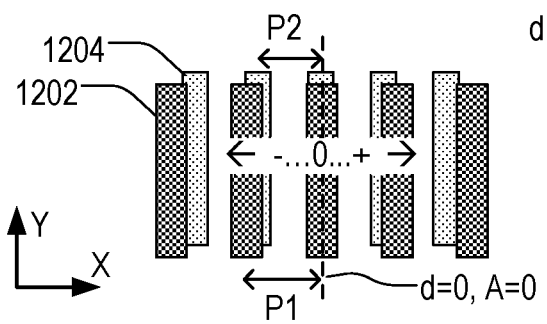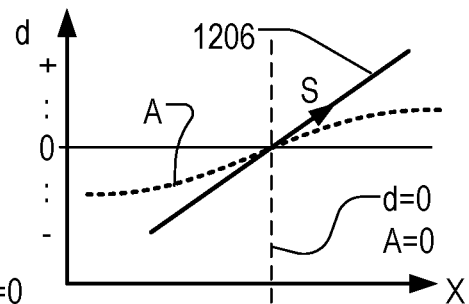
Fig. 12(a)   Fig. 12(b)
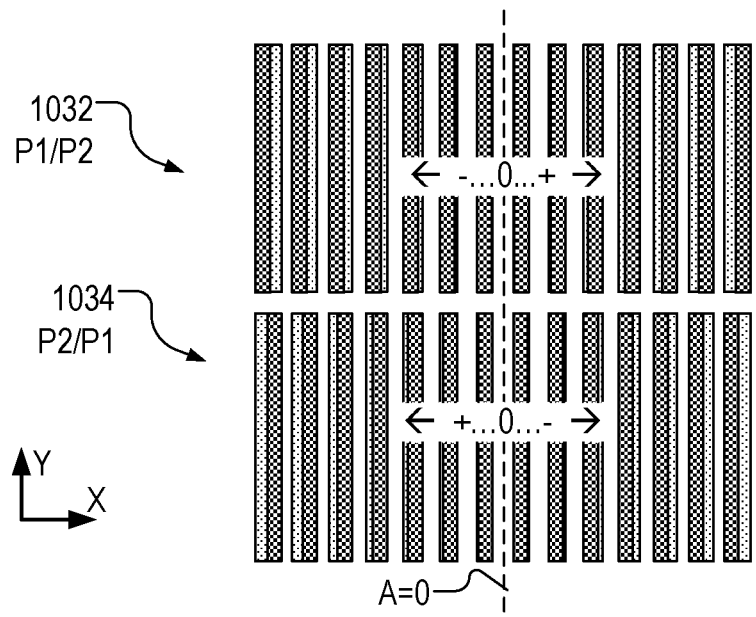
Fig. 13(a)
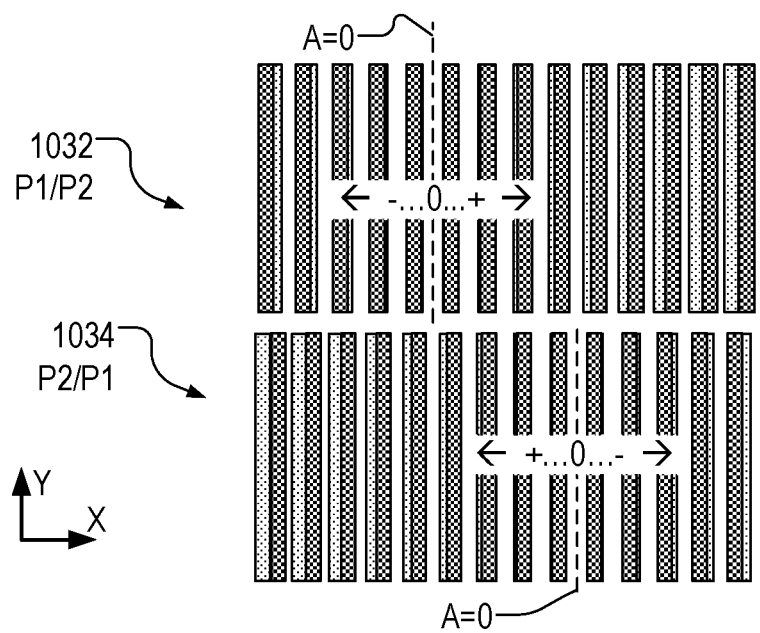
Fig. 13(b)

METROLOGY METHOD, PATTERNING DEVICE, APPARATUS AND COMPUTER PROGRAM

CROSS-REFERENCE TO RELATED APPLICATIONS

This application is a continuation application of U.S. patent application Ser. No. 16/594,613, filed on Oct. 7, 2019, which claims priority to European Patent Application 18199182.9, filed on Oct. 8, 2018, the entire contents of all of which are incorporated herein by reference.

BACKGROUND

Field of the Invention

The present invention relates to methods and apparatus for metrology usable, for example, in the manufacture of devices by lithographic techniques and to methods of manufacturing devices using lithographic techniques. The invention further relates to patterning devices and computer program products usable in such methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. Modifications of the apparatus to improve throughput are described in US2010201963A1 and US2011102753A1. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the −1st and the +1st diffraction order intensities. The intensity asymmetry, a comparison of these diffraction order intensities, for a given overlay target provides a measurement of asymmetry in the target. This asymmetry in the overlay target can be used as an indicator of overlay (undesired misalignment of two layers).

In the known method using four distinct sub-targets, a certain portion of the patterned area is not usable due to edge effects. In semiconductor product designs the efficient use of space is very important. The use of only two specific offsets enforces the above assumption of linearity, which may lead to inaccuracy when the true relationship is non-linear. To increase the number of offsets in the known designs used would increase the space used.

SUMMARY OF THE INVENTION

It would be desirable to be able to perform metrology of overlay or other performance parameters with increased accuracy, and/or with less space used for the targets.

The invention in a first aspect provides a method of measuring a performance parameter of a lithographic process, as defined in appended claim 1.

The invention in a second aspect further provides a patterning device for use in a lithographic apparatus, the patterning device comprising portions that define one or more device patterns and portions that define one or more metrology patterns, the metrology patterns including at least one target for use in a method of the first aspect of the invention as set forth above, the target having a bias variation between locations on the target, said bias variation being in an asymmetry-related property.

The invention in a further provides a metrology apparatus comprising: an illumination system configured to illuminate with radiation a target; a detection system configured to detect scattered radiation arising from illumination of the target; wherein said metrology apparatus is operable to perform the method of the first aspect of the invention as set forth above.

The invention further provides a computer program comprising processor readable instructions which, when run on suitable processor controlled apparatus, cause the processor controlled apparatus to perform the method of the first aspect, and a computer program carrier comprising such a computer program.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIGS. 8(a)-8(b) show in schematic detail the implementation of continuous bias in one grating of the target of FIG. 6 under conditions of 8(a) zero overlay and 8(b) non-zero overlay, according to one embodiment of the present disclosure;

FIG. 9 shows in schematic detail the arrangement of continuous bias gratings in the multiple grating target of FIG. 6, according to one embodiment of the present disclosure;

FIGS. 12(a)-12(b) show 12(a) in schematic detail the implementation of continuous bias in one grating of the target of FIG. 10, while 12(b) shows the variation of bias with position in such a grating;

FIGS. 13(a)-13(b) show in schematic detail the implementation of continuous bias in two gratings of the multi-grating target of FIG. 10 under conditions of 13(a) zero overlay and 13(b) non-zero overlay, according to one embodiment of the present disclosure;

DETAILED DESCRIPTION OF EXEMPLARY EMBODIMENTS

Before describing embodiments of the invention in detail, it is instructive to present an example environment in which embodiments of the present invention may be implemented.

Figure 1:
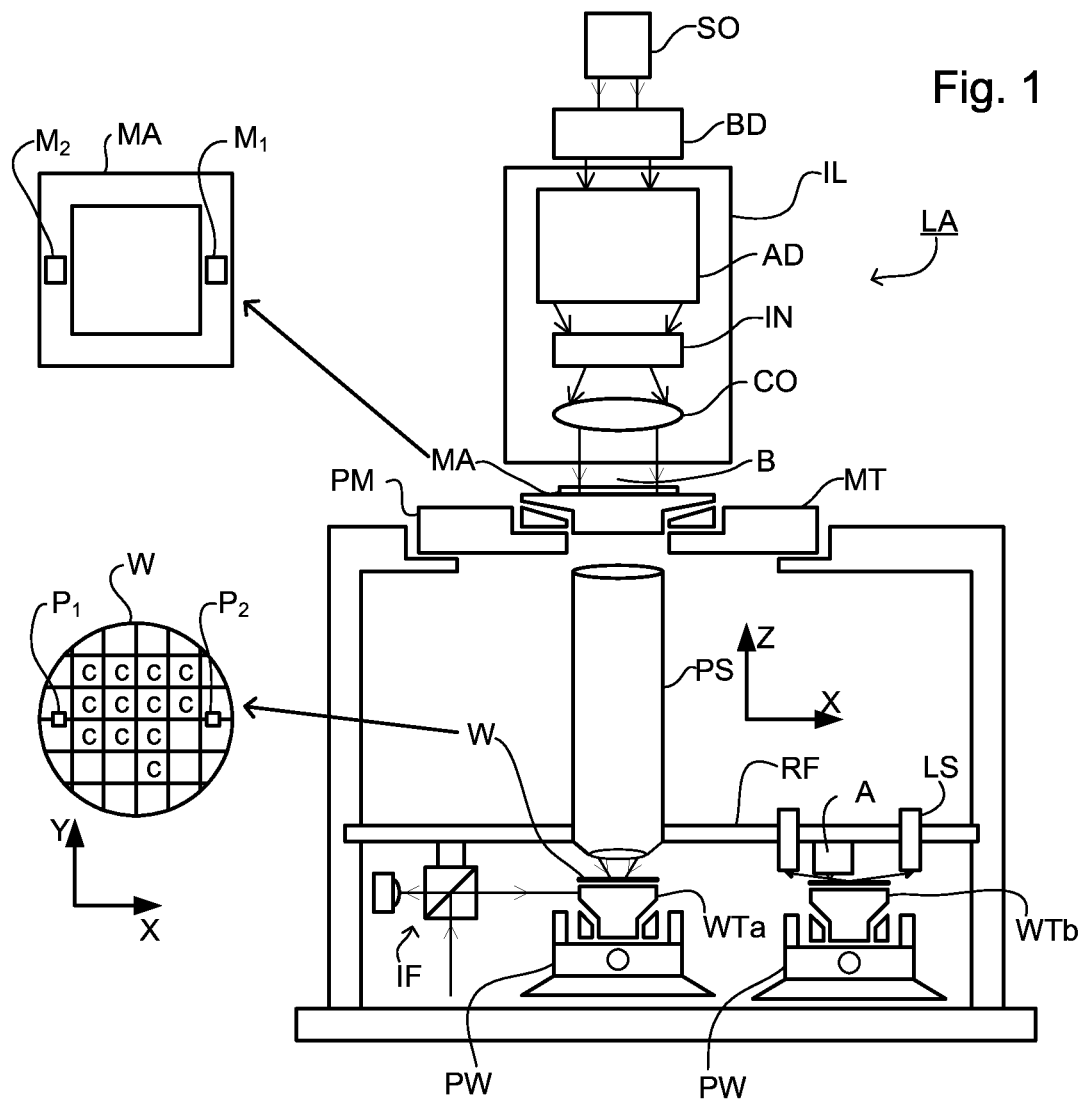
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
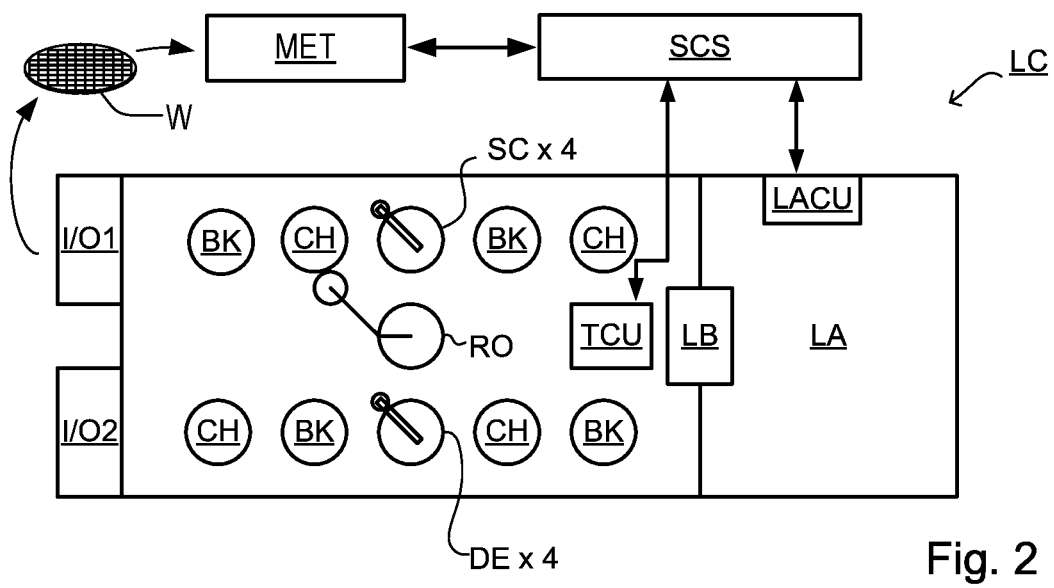
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, 2nd, 3rd and higher order beams (not shown in FIG. 3) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Using for example the method described in applications such as US20110027704A, mentioned above, overlay error (i.e., undesired and unintentional overlay misalignment) between the two layers within the sub-targets 32 to 35 is measured. Such a method may be referred to as micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry.

In a known method using a multi-grating target such as that illustrated in FIG. 4, with overlay OV can be determined via the following equation:

$$OV = \frac{p}{2\pi}\tan^{-1}\left(\tan\left(\frac{2\pi d}{p}\right)\left(\frac{(I^{+1}_{+d} - I^{-1}_{+d}) + (I^{+1}_{-d} - I^{-1}_{-d})}{(I^{+1}_{+d} - I^{-1}_{+d}) - (I^{+1}_{-d} - I^{-1}_{-d})}\right)\right) \quad \text{(Equation 1)}$$

$$\cong d\frac{A_{+d} + A_{-d}}{A_{+d} - A_{-d}}$$

where:

$I_{+d}^{+1}$ is the $+1^{st}$ diffraction order from positive bias target (e.g., intensity value);

$I_{+d}^{-1}$ is the $-1^{st}$ diffraction order from positive bias target;

$I_{-d}^{+1}$ is the $+1^{st}$ diffraction order from negative bias target;

$I_{-d}^{-1}$ is the $-1^{st}$ diffraction order from negative bias target;

$A_{+d} = I_{-d}^{+1} - I_{-d}^{-1}$, (e.g., asymmetry in the +1' and −1' intensities from positive bias target); and $A_{-d} = I_{-d}^{+1} - I_{-d}^{-1}$, (e.g., asymmetry in the +1' and $-1^{st}$ intensities from negative bias target).

Equation 1 can be reformulated in terms of a sensitivity coefficient K which is a stack dependent parameter having the special property of being overlay independent (assuming a perfect target):

$$A_{+d} + A_{-d} = K \cdot OV \quad \text{(Equation 2)}$$

where:

$$K = \frac{A_{+d} - A_{-d}}{d} \quad \text{(Equation 3)}$$

While Equation 2 is a simple linear equation, based on an assumption of small bias values and overlay errors, compared with a pitch of the gratings that form the sub-targets, the dependence of asymmetry on overlay error and bias over a wider range, has a substantially sinusoidal form. A sinusoidal model can also be used, instead of the linear model of Equation 2.

The known method using four distinct sub-targets requires borders around each sub-target (not shown in FIGS. 4 and 5) to make them distinctive in the image 40. This means that a certain portion of the patterned area is not usable due to edge effects. Additionally, the use of only two specific offsets enforces the above assumption of linearity, which may lead to inaccuracy when the true relationship is non-linear.

In the following, we disclose solutions including overlay targets with continuous variation of bias, and/or multiple bias values. When applied in the image plane overlay measurement techniques just described, the multiple bias values can be seen in an intensity image over the target area. Verification of linearity and/or sinusoidal fitting can be performed to ensure that quality information is being used. Additionally, more information about the sensitivity of the target and the measurement apparatus to overlay and other factors can be obtained. Embodiments will be illustrated based on rotation or staggering of one or both gratings forming an overlay grating. Embodiments will be illustrated based on different pitches of top and bottom gratings. With appropriate design, more of the current area can be used in the signal determination. Target size may be reduced, and/or measurement accuracy increased, compared with the current technique.

Figure 6:
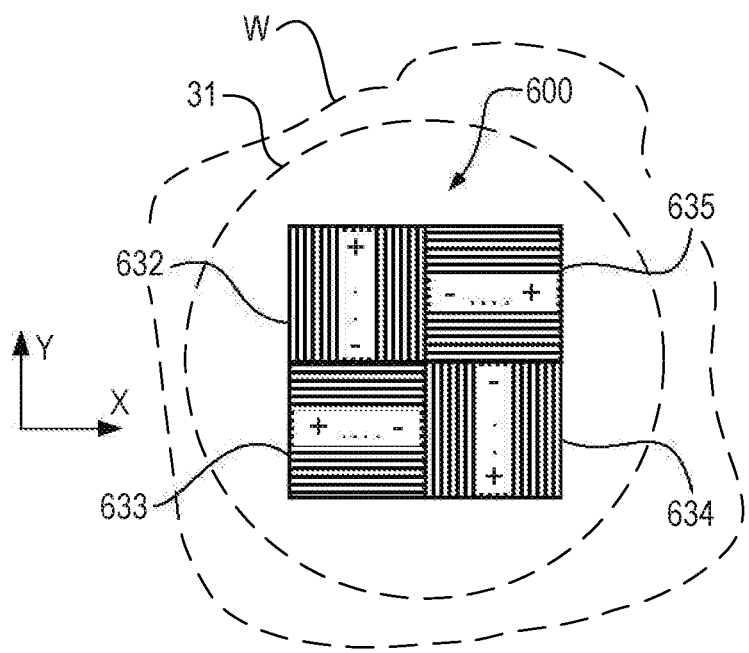
FIG. 6 depicts a first example of a multiple grating target including continuous bias features according to an aspect of the present disclosure.

FIG. 6 shows a multi-grating target 600, comprising individual sub-targets 632 to 635. As in the target of FIG. 4, the four sub-targets comprise two overlay gratings for measurement in the X direction and two overlay gratings for measurement in the Y direction. Instead of providing a fixed overlay bias within each grating, however, a multi-step or continuous variation of bias including negative values, positive values and intermediate values is provided. Gratings 632 and 635 have bias values increasing with Y and X,X and Y, respectively. Conversely, gratings 633 and 634 have bias values decreasing with X and Y, respectively. It is a matter of design choice, whether the target 600 and the individual sub-targets have the same dimensions as a known target, or are made larger or smaller.

Figure 7:
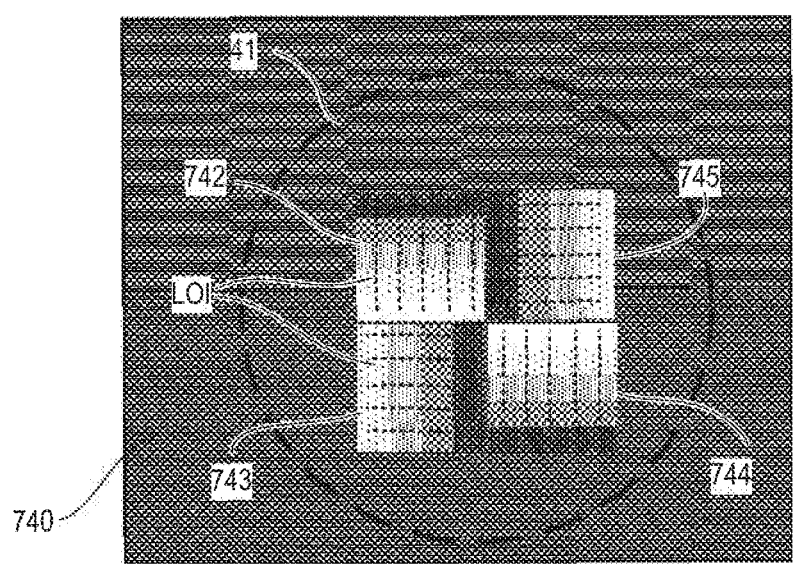
FIG. 7 depicts an image of the target of FIG. 6 obtained in the scatterometer of FIG. 3.

FIG. 7 shows schematically the corresponding image 740 captured on sensor 23 in the apparatus of FIG. 3. Reference signs 742 to 745 indicate the intensity image regions corresponding to the individual sub-targets. Due to the variation of bias over each sub-target, the intensity varies, rather than being constant within each region. Instead of regions of interest ROI, one can imagine "lines of interest" LOI, aligned with the direction of variation of bias, as shown. The manner of processing the intensity information to obtain overlay measurements will be described later. First, various possible implementations of the continuous-bias targets will be illustrated.

In FIG. 8(*a*), using the sub-target 632 of FIG. 6 as an example, the sub-target comprises an overlay grating having features 802 printed over underlying features 804. In all of the examples herein, it will be understood that features are shown enlarged for illustrative purposes only. The real gratings may have tends of hundreds of lines. The features 804 and 802 are formed so as to lie not parallel, but with a small angle of deviation between them, for example between 0.1 and 0.5°, for example 0.35°. In the example, the underlying features 804 have been printed at an angle to the y-axis. In a practical implementation, either or both layers may be rotatable relative to the axis. As a result, within orientation of lines as shown, a bias value d varies from zero across the middle of the target to positive values above the middle and negative values below the middle. The bias value is in the X direction, and varies continuously in the Y direction across the target In an alternative implementation, rather than sloping lines, one or both lines may be staggered in a series of fine steps in bias may be implemented.

In the situation shown in FIG. 8(*a*), the overlay error OV is zero, so that asymmetry A is zero along the same line where bias is zero. On the other hand, referring to FIG. 8(*b*), when overlay in the X direction is not zero, the line where asymmetry is zero is shifted in the Y direction.

FIG. 9 shows the four sub-targets 632 to 635, having the form shown in FIG. 8, and with the appropriate orientation and polarity of bias variation.

Figure 10:
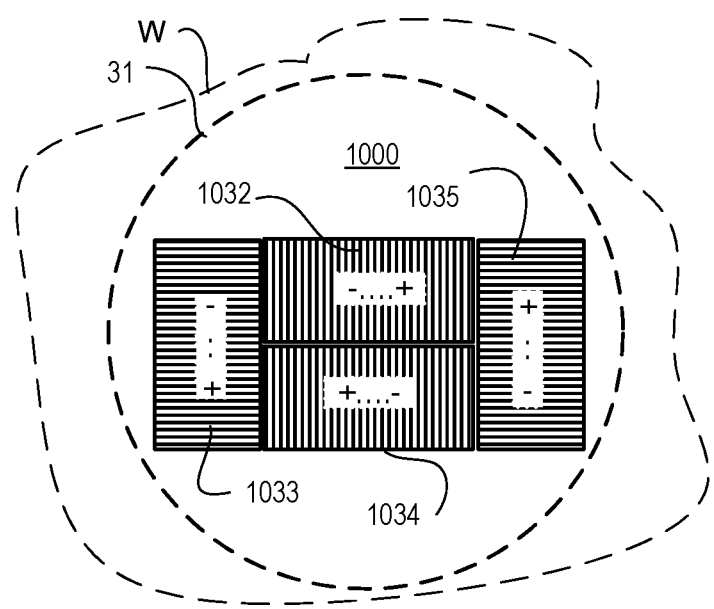
FIG. 10 depicts a second example of a modified multiple grating target including continuous bias features according to an aspect of the present disclosure.
Figure 11:
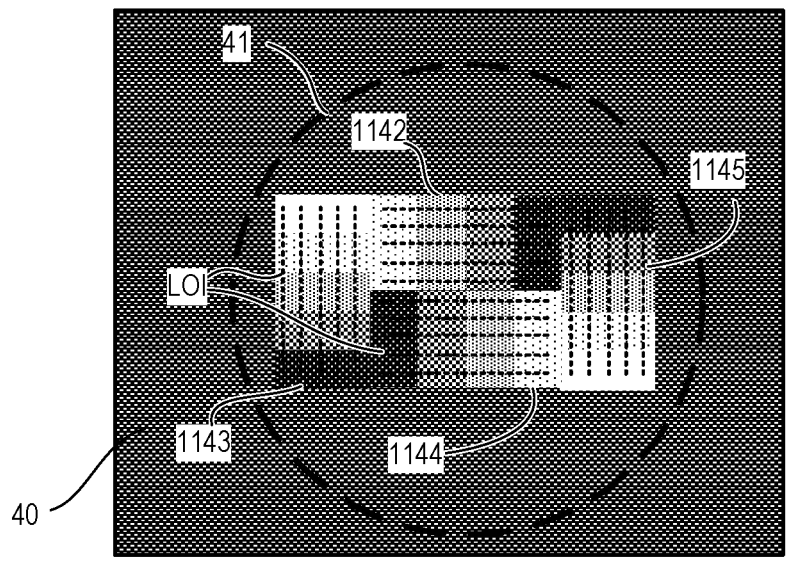
FIG. 11 depicts an image of the target of FIG. 10 obtained in the scatterometer of FIG. 3.

FIG. 10 shows another example target design having continuous or multi-step bias in four sub-targets, numbered 1032 to 1035. Each sub-target in this case has the form of a rectangle, rather than a square. Otherwise, the orientation of the grating of sub-targets 1032 to 1035 are the same as in the targets 632 to 635, respectively, in the example of FIGS. 6 to 9. FIG. 11 shows the corresponding image, with regions 1142 to 1145 corresponding to the sub-targets 1032 to 1035. Again, the variation in bias causes a variation of intensity over the image of each sub-target, rather than a single region of interest having uniform intensity.

FIG. 12(*a*) illustrates one possible implementation of the rectangular continuous bias sub-targets of FIG. 10. A grating of only a few lines having exaggerated bias variation is shown, for the purpose of explanation. Line features 1202 in a top layer of the sub-target, are printed overlying features 1204 in a bottom layer. Instead of rotating one or both sets of line features to obtain a bias variation, in this example, the pitch (period) of the grating in the top and bottom lines is different. Features 1202 in the top layer are arranged with a pitch P1, while features 1204 in the bottom they are arranged with a slightly smaller pitch P2. This causes a linear variation of bias d as shown by the line 1206 and the graph of FIG. 12(*b*). The line has a slope S. In contrast to the rotation example of FIGS. 6 to 7, the variation of bias, and hence the lines of interest LOI, is parallel to the direction of periodicity of the grating.

Also shown in the graph is a sinusoidal curve representing the variation of asymmetry A across the grating. Assuming overlay error to be zero, the bias d and asymmetry A our zero along the same line, as indicated. In the presence of overlay error, this relationship breaks down. In order to be able to determine overlay error, a shift of the zero asymmetry point relative to the known line of zero bias can be measured. To do this from a single target, however, would require very precise measurement of the position of the target, to know the position of the zero bias line. As will be illustrated with FIG. 13, the provision of complementary pairs of sub-targets with opposite bias variation allows more accurate measurement of overlay, and also makes the measurement robust against variations attributable to process effects, and asymmetry in the measurement apparatus.

FIG. 13 shows the sub-targets 1032 and 1034, under conditions (a) of zero overlay error and (b) of non-zero overlay error in the X direction. It will be understood that the same explanation will apply to the Y-direction sub-targets 1033 and 1035. As labeled, sub-target 1032 has the larger pitch P1 over the small pitch P2. Bias d increases progressively with increasing X. By contrast, sub-target 134 has the smaller pitch P2 over the larger pitch P1. Consequently, bias d decreases progressively with increasing X.

Accordingly, when an overlay error is introduced, as shown at FIG. 13(b), the lines of zero asymmetry in the two sub-targets move equally but in opposite directions relative to the line of zero bias. By comparing the asymmetries measured from the intensity images 1142 and 1144 of the pair of sub-targets, overlay error can be measured.

The complete overlay measurement method will be described now with reference to FIG. 14 using the example of the target 1000 of FIGS. 10 to 13. The method may be applied to the continuous bias targets of FIGS. 6 to 9, and to alternative examples including ones illustrated and described further below. For the sake of example, FIG. 15 illustrates detail of the method in (a) the measurement of asymmetry variation over the length of the sub-target 1032 of target 1000 and (b) the measurement of asymmetry variation over the length of the sub-target 1034.

Figure 14:
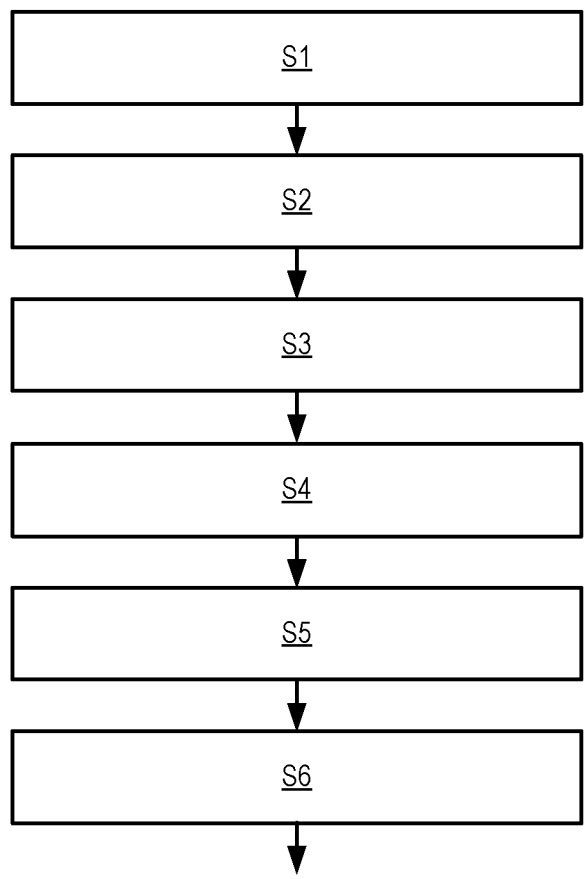
FIG. 14 is a flowchart showing the steps of an overlay measurement method using the scatterometer of FIG. 3.

In FIG. 14 at step S1, the substrate, for example a semiconductor wafer, is processed through a lithographic apparatus, such as the lithographic cell of FIG. 2, one or more times, to create an overlay target including the sub-targets 1032-1035. At S2, using the metrology apparatus of FIG. 3, an image of the sub-targets 1032 to 1035 is obtained using only one of the first order diffracted beams (say −1). At step S3, a second image of the overlay targets using the other first order diffracted beam (+1) is captured in a second image. While we refer for simplicity to a single image, multiple images may be taken, either under the same illumination conditions or under different conditions, to increase the information available, and achieve a desired level of measurement performance. Illumination conditions may vary for example in wavelength and/or polarization.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level.

Figure 15A:
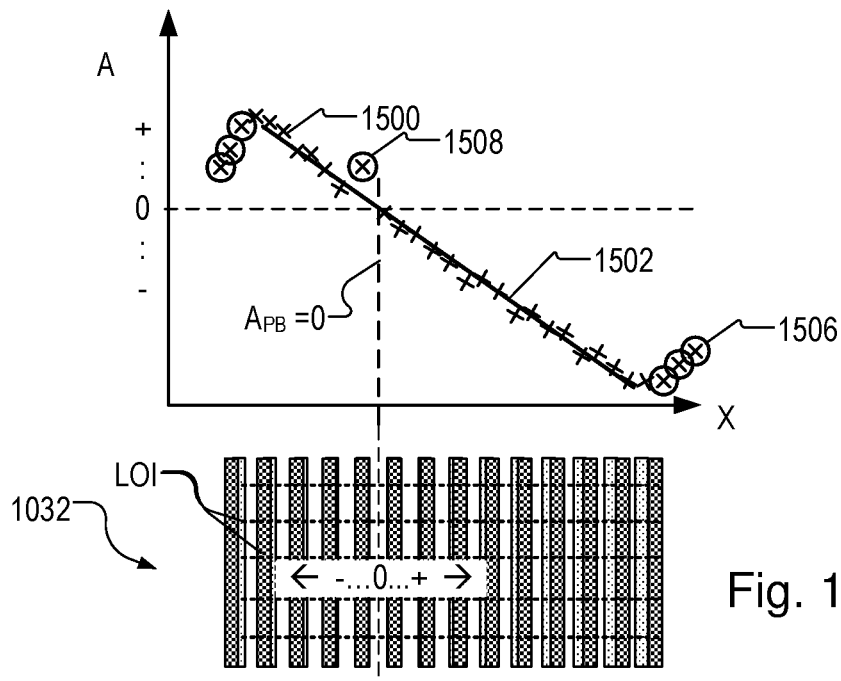
FIGS. 15(a)-15(b) illustrate 15(a) signal processing in relation to the first one of the gratings shown in FIGS. 13 and 15(b) signal processing in relation to the other of the gratings shown in FIG. 13, including graphical illustration of the principles of calculation of overlay error in one embodiment of the present disclosure.

In step S4, intensity values are sampled along one or more lines of interest LOI illustrated in FIGS. 15(a) and (b) aligned with the direction of variation of bias within the image of each component overlay target.

In step S5 the variation of asymmetry over each sub-target is determined the processor PU by comparing the intensity values obtained for +1 and −1 orders for each sub-target 1032-1035. The by simple subtraction, or in ratio form, as is known. Techniques similar to those used in known methods can be applied for identifying the regions of interest and aligning the +1 and −1 images to pixel accuracy, can be applied.

It is a matter of implementation, whether intensity values for all lines of interest LOI are combined before being compared to derive asymmetry, or whether asymmetry values are derived along lines of interest, and then combined to obtain an average asymmetry. As illustrated in FIGS. 15(a) and (b), the presence of a variation of bias of known slope in the target allows additional information, and data verification to be performed as a preliminary step in step S5. For example, asymmetry sample values 1500 can be fitted to a predicted linear or sinusoidal relationship (curve 1502, 1504). Edge regions of the target can be clearly identified by deviation from the fitted curve, as seen at 1506. Anomalous values 1508, 1510 can be identified similarly. The circled sample values can be excluded from calculation. Where the bias and/or overlay error drive the signals into non-linear regions of the asymmetry curve, a linear section of the response can be identified, and only values from this section used, if desired. Such filtering can be performed in the asymmetry values, as shown, and/or in the intensity values, prior to calculating asymmetry.

As will be illustrated further below, targets of suitable design can include "anchor points", so that this preprocessing can also improve alignment of features between the sub-target images.

In step S6 the measured intensity asymmetries for a number of overlay targets are used, together with knowledge of the known variation of overlay biases of those overlay targets, to calculate one or more performance parameters of the lithographic process in the vicinity of the overlay target T. A performance parameter of great interest is overlay.

The current overlay calculation method was described above, with reference to Equations 1, 2 and 3. Different methods can be applied using the continuous bias/multiple biased targets of the present disclosure.

FIG. 15 illustrates one method, based on fitting a curve with the expected behavior. In the linear example illustrated:

$$A_{PB}=a_{PB}*X+b_{PB}; A_{NB}=a_{NB}*X+b_{NB}; \text{ or}$$

$$A_{PB}=K*(OV+S*X)+b_{PB}; A_{NB}=K*(OV-S*X)+b_{NB}$$

Where APB and ANB are the asymmetry values at each point X along the sub-target 1032 having positive bias variation and along the sub-target 1034 having negative bias variation. Factors aPB, bPB, aNB, bNB depend upon the case. In the ideal case, it is expected that aPB=aNB. The second equations translate these factor into terms of the process-dependent factor K mentioned already above, the unknown overlay error OV, and the known slope S of the bias variation. It is assumed that the slope S is the same between the two sub-targets, differing only in sign.

In case a sinusoidal model would be applied, the equations become:

$$A_{PB}=b_{PB}+K*\sin(OV+S*X); A_{PB}=b_{NB}+K*\sin(OV-S*X);$$

Figure 15B:
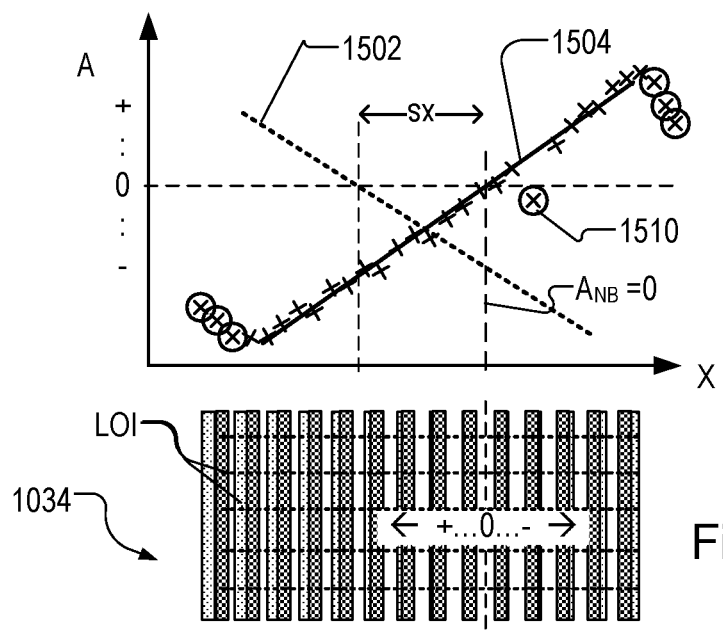

In FIG. 15(b), the curve 1502 which is the asymmetry variation for the sub-target 1032 with positive bias variation is superimposed on the same graph as the asymmetry variation for the sub-target 1034 with negative bias variation. Due to a positive overlay error OV, the line of zero asymmetry has moved to the left of the line of zero bias for the sub-target 1032, and the line of zero asymmetry for the sub-target 1034 has moved to the right. To determine overlay, the processor calculates the shift (xs) between the zero points of the asymmetries APB and ANB. Then it is a simple matter to calculate overlay from the shift xs and the known slope of the target. In the case of a linear model, this is:

$$OV = xs/S$$

A sinusoidal model can be applied, if desired.

In an alternative implementation, overlay is calculated for each spatial position along the lines of interest, for example as follows:

$$K = (A_{PB} - A_{NB})/S^*X$$

$$OV = (A_{PB} + A_{NB})/[S^* X^* (A_{PB} - A_{PB})]$$

The results from all the positions can be combined into a single overlay measurement. Again, a sinusoidal model can be applied, if desired. As mentioned above, it is a matter of implementation, whether such a calculation is performed separately for various lines of interest LOI, and then combined, or whether pixel values are averaged in the direction transverse to the lines of interest, before being used in the calculation. A filtering step to remove nonlinear regions (non-sinusoidal regions) and outliers can be applied in the overlay curve, before the results are combined, based on the principles illustrated for the asymmetry curves in FIG. 15.

Regions with equal bias should have the same asymmetry response on both curves, but deviations can be caused by misalignment and optical and/or processing effects. This will introduce inaccuracy in the methods as described so far above. Accordingly, in some embodiments, features are included that may be used as "anchor points" to facilitate alignment of the asymmetry curves, before they are combined to calculate overlay.

Figure 16:
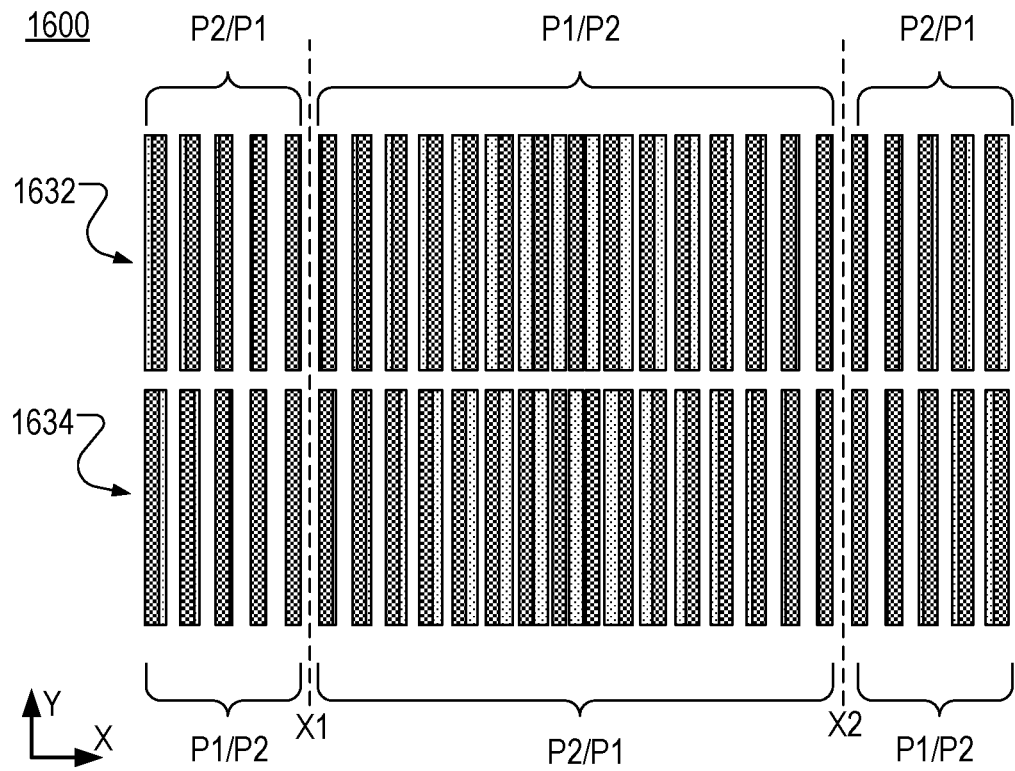
FIG. 16 shows in schematic detail implementation of continuous bias in two gratings of a modified multi-grating target, including the provision of anchor points according to another embodiment of the present disclosure.
Figure 17A:
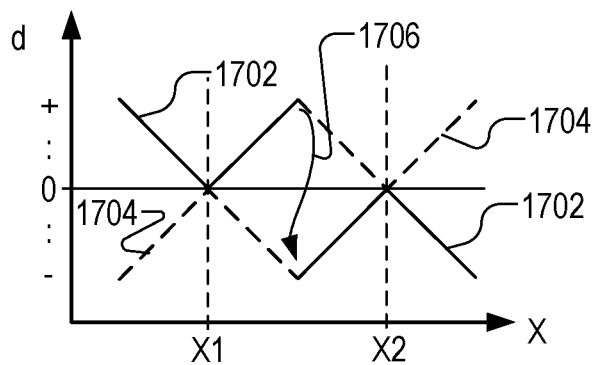
FIGS. 17(a)-17(c) illustrate 17(a) the inclusion of bias slope changes as an example of anchor points in the multi-grating target of FIG. 16, 17(b) asymmetry signals obtained from the gratings shown In FIG. 16 under conditions of non-zero overlay, and 17(c) correction of the asymmetry signals using knowledge of the anchor points.
Figure 17B:
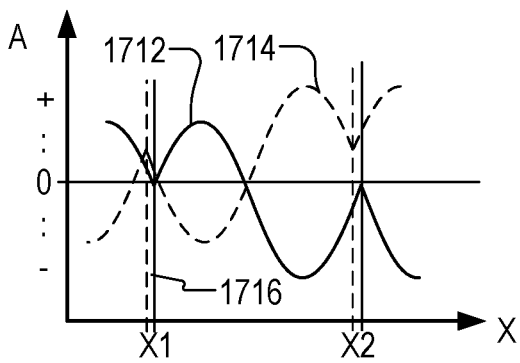
Figure 17C:
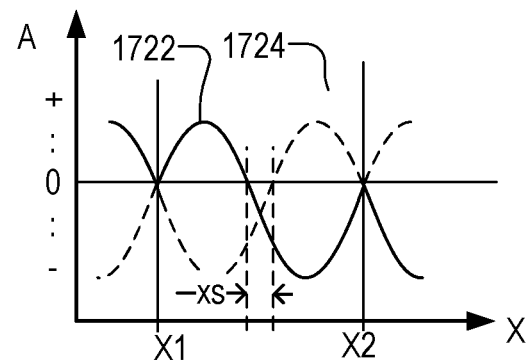

In the example of FIGS. 16 and 17, anchor points are embedded within the variation of bias across the target. Part of a modified multi-grating target 1600 is shown, which is a modified version of the one shown in FIGS. 10 to 13. Two sub-targets 1632 and 1634 are shown. In a middle section of each target, the top and bottom grating pitches P1 and P2 are the same as in the target 1000. However, in other regions, the pitches P1 and P2 are reversed, so that the slope of the bias variation changes (in this example, reverses) at known points in the structure. In the example, the slope reverses at positions X1 and X2, as marked. In an example, which is not shown in FIG. 16, the bottom grating of target 1632 has the pitch P2, and the top grating of target 1632 comprises two regions, both overlapping bottom grating with pitch P2, wherein the first region of the top grating of target 1632 has a pitch P1 smaller than P2 of the bottom grating of target 1632, and the first region of the top grating of target 1632 has a pitch P3 larger than the pitch P2 of the bottom grating of target 1632.

FIG. 17(*a*) shows the slope reversals when the bias d is plotted against position X for the sub-target 1632 (curve 1702, solid lines) sent for the sub-target 1634 (curve 1704, broken lines). Note that the variation of bias is cyclic, for the purposes of asymmetry measurement, indicated by the step 1706.

In FIG. 17(*b*) the sinusoidal variation of asymmetry is shown, as measured from the image 1142 of sub-target 1632 (curve 1712, solid lines) and from the image 1144 of sub-target 1634 (curve 1714, broken lines). A difference in the position of zero crossings between these curves is caused by the shift xs corresponding to overlay error, but it may also be caused by an error in the image alignment, or caused by processing effects or optical effects in the apparatus. Because the slope changes incorporated in the target 1600 provide recognizable anchor points deviating from the sinusoidal form of curves 1712 and 1714, this source of error can be identified by misalignment between the anchor points, indicated for example at 1716 in FIG. 17(*b*).

In FIG. 17(*c*), the curves 1712 and 1714 have been re-plotted as curves 1722 and 1724, shifted to align the anchor points so that these points with the known same bias and same X position are aligned. From these curves, the shift xs between the zero crossings of the curves is calculated, and overlay is calculated as described above.

When multiple anchor points are provided, an average of their relative shifts can be used to obtain the best fitting of the curves. The number of anchor points may be less than two or more than two. In principle, a grating of the type shown having three or more changes of slope could be used by itself, without requiring a second grating for comparison. This is because sub-targets having the desired sequence of positive bias variation and negative bias variation can be found within the same extended structure. Accordingly, "sub-targets" should be interpreted to include overlapping regions within a single grating structure. While the above example includes reversals of slope as anchor points, other types of anchor point can be included, including small regions of constant bias. Regions of constant bias and reversals of slope could be included in the same target, either at the same or at different locations. Note that regions of constant bias are examples of changes of slope, and changes of slope is not limited to reversals of slope. The slope changes may be designed to occur in a region where the asymmetry is sensitive to bias change, as in the example shown. Sensitivity does depend on process effects and optical effects, and therefore this cannot be perfectly controlled.

Figure 18:
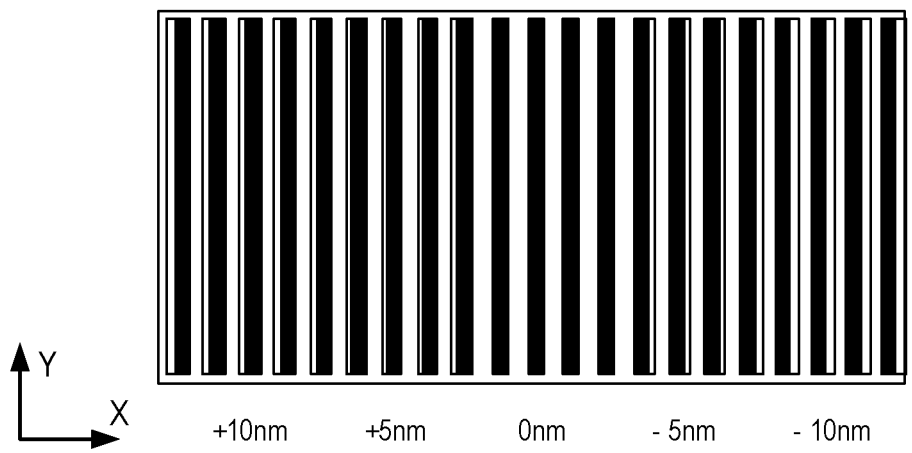
FIG. 18 illustrates an example of a grating having multi-step bias as an alternative to continuous bias, according to another example of the present disclosure.

FIG. 18 shows an example of a substructure having not a continuous bias variation, but a stepwise variation of bias. Provided the variation of bias is known, the appropriate curve can be fitted to the observed intensities and asymmetries.

Figure 19:
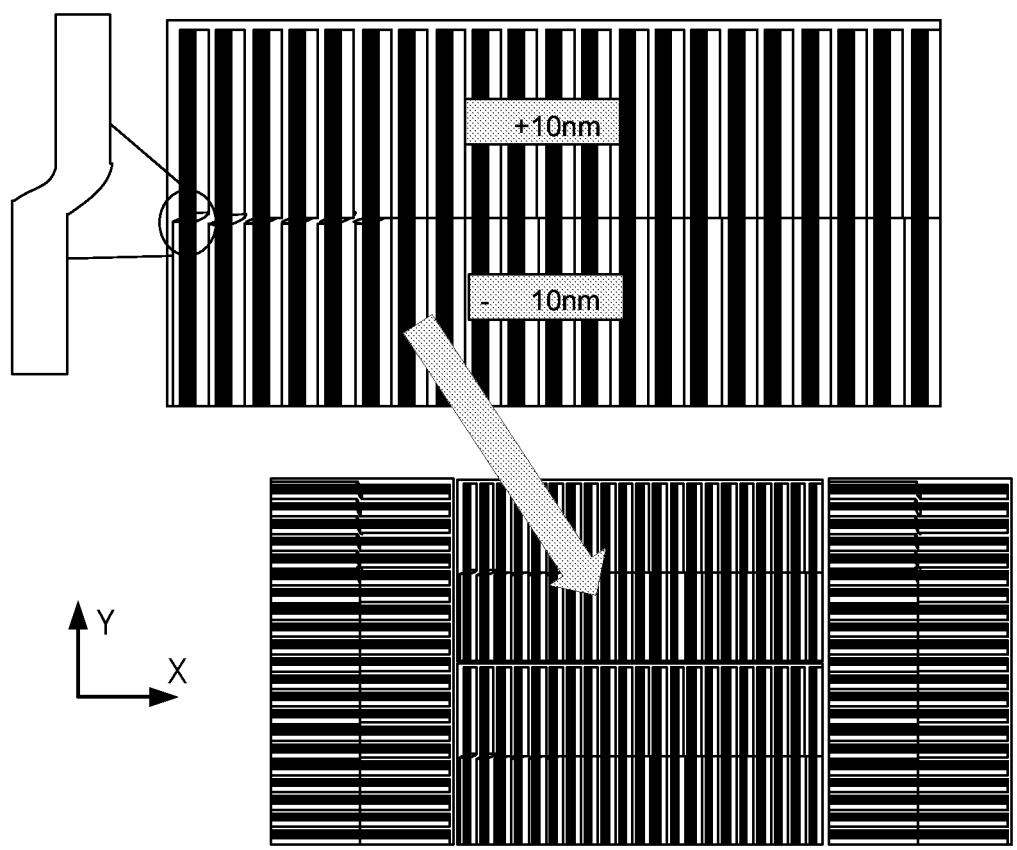
FIG. 19 illustrates a multi-grating target having dual bias gratings according to another example of the present disclosure.

FIG. 19 shows a further variation in which each sub-target of a multi-grating target has regions of different bias. In this example, the X direction bias changes from −10 nm to +10 nm, in the Y direction.

Figure 20:
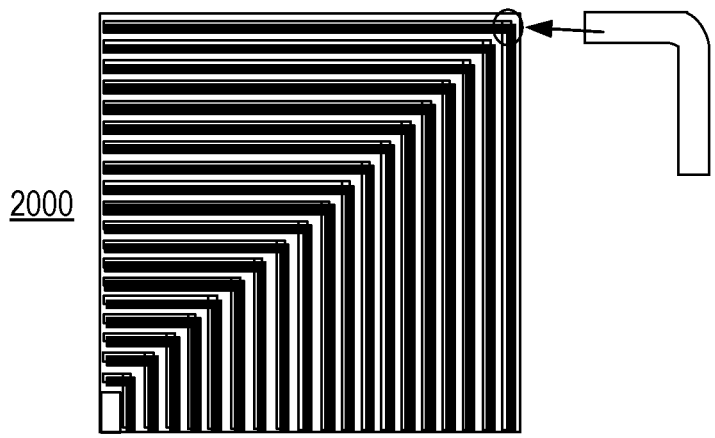
FIG. 20 illustrates an alternative grating target having overlay bias in two directions, based on L-shaped features.
Figure 21:
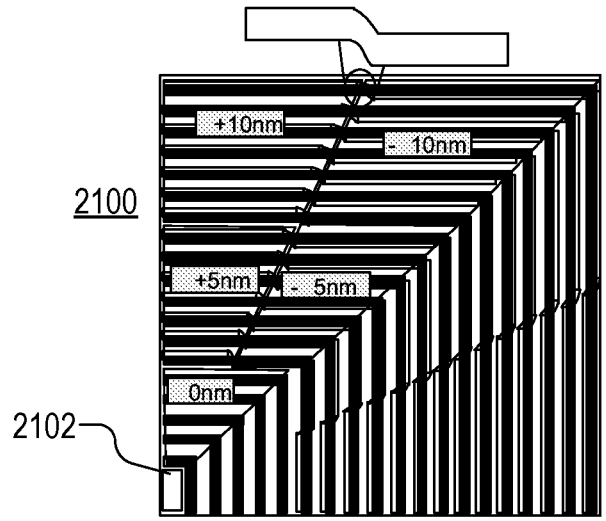
FIG. 21 illustrates a modified version of the grating of FIG. 20, modified to include a multi-step arrangement of bias regions.
Figure 22:
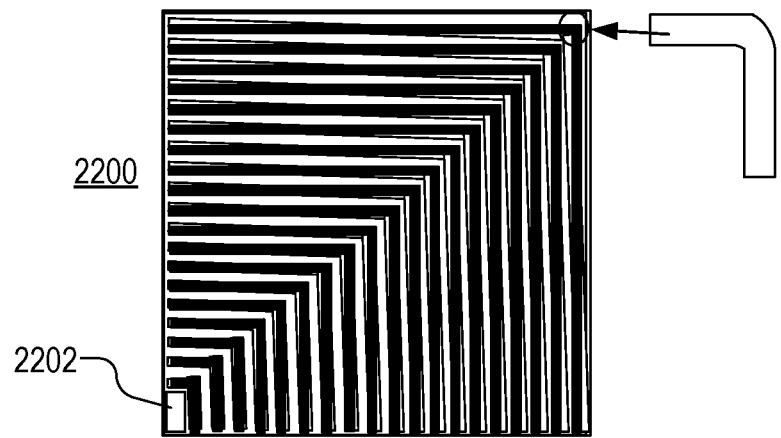
FIG. 22 illustrates another modified version of the grating of FIG. 20, modified to include continuous bias by rotation of L-shaped features, according to yet another embodiment of the present disclosure.

FIG. 20 illustrates a target or sub-target 2000 in which L-shaped line features are used to provide a grating with both X and Y diffraction. In FIG. 21, such a design is adapted to provide a target 2100 in which stepwise variation of bias is provided along lines of interest in different segments of the target. Biases ranging from −10 nm to +10 nm in the Y direction are labeled. FIG. 22 shows a target 2200 in which the L-shaped line features of a bottom grating are slightly rotated, in the manner of FIG. 6, thereby providing continuous variation of bias across the target. The targets 2120 and 2200 are provided with alignment features 2102 and 2202, respectively, to assist in alignment of the images for extracting intensity measurements.

Figure 23:
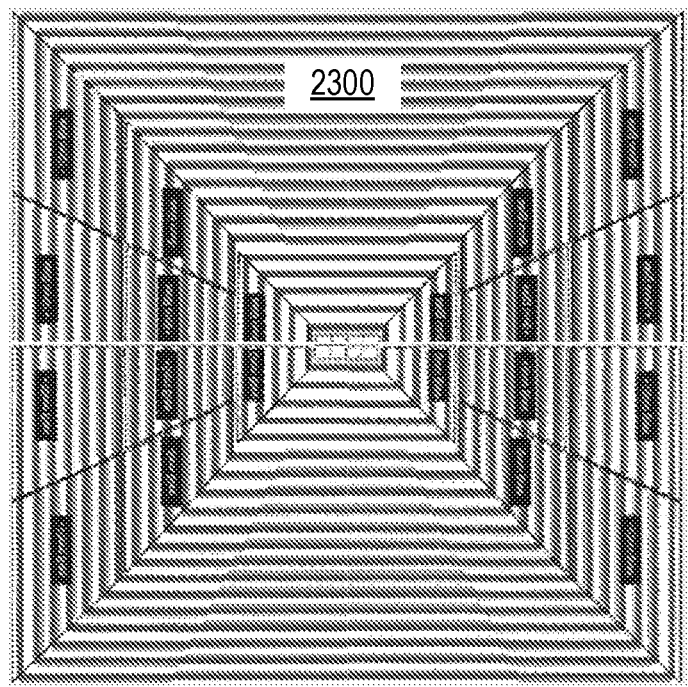
FIGS. 23 and 24 illustrate targets having multi-step arrangement of bias regions in four quadrants, based on the arrangement of FIG. 21.
Figure 24:
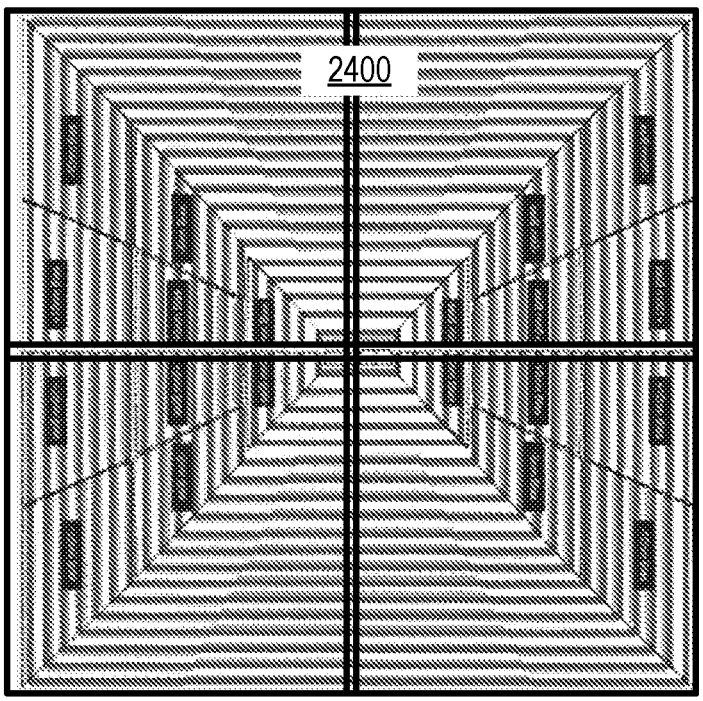

FIG. 23 illustrates a larger target 2300 incorporating the features of target 2200, but repeated around a square. FIG. 24 illustrates a target 2400 in which four sub-targets having the form of target 2200 but rotated are provided.

The above are only some examples of target designs that can be implemented applying the concepts disclosed herein.

The methods described are only example methods of how signals from these targets can be processed to obtain improved overlay measurement, and/or improved utilization of space on a substrate.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' A used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets A realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps S1-S6 and so calculate overlay error.

The program may optionally be arranged to control the optical system, substrate support and the like to perform the steps S1-S6 for measurement of asymmetry on a suitable plurality of targets.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), A well A particle beams, such A ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A target formed on a substrate, the target comprising:
   a first pair of sub-targets comprising:
      a first sub-target; and
      a second sub-target; and
   a second pair of sub-targets comprising:
      a third sub-target; and
      a fourth sub-target,
   wherein the first and second sub-targets are arranged adjacent to each other vertically and the third and fourth sub-targets are arranged on opposite sides of the first and second sub-targets, wherein left sides of the first and second sub-targets are adjacent to the third sub-target, wherein right sides of the first and second sub-targets are adjacent to the fourth sub-target,
   wherein each sub-target comprises an overlay grating with a top layer and a bottom layer with different pitches, and
   wherein the target comprises a continuous variation of bias values across each sub-target.

2. The target of claim 1, wherein:
   features in a top layer of the first sub-target are arranged with a first pitch;
   features in a bottom layer of the first sub-target are arranged with a second pitch; and
   the first pitch is larger than the second pitch.

3. The target of claim 1, wherein:
   features in a top layer of the second sub-target are arranged with a first pitch;
   features in a bottom layer of the second sub-target are arranged with a second pitch; and
   the first pitch is smaller than the second pitch.

4. The target of claim 1, wherein the continuous variation of bias values across each sub-target is associated with an asymmetry-related property of the target.

5. The target of claim 1, wherein the sub-targets in the first and second pairs have equal and opposite bias variations.

6. The target of claim 1, wherein the first and second sub-targets have a same orientation that is perpendicular to an orientation of the third and fourth sub-targets.

7. The target of claim 1, wherein the sub-targets of the first and second pairs are rectangular.

8. A patterning device for use in a lithographic apparatus, the patterning device comprising:
   portions that define one or more device patterns; and
   portions that define one or more metrology patterns,
      wherein the one or more metrology patterns comprise a target, the target comprising:
         a first pair of sub-targets comprising:
            a first sub-target; and
            a second sub-target; and a second pair of sub-targets comprising:
a third sub-target; and
a fourth sub-target,
wherein the first and second sub-targets are arranged adjacent to each other vertically and the third and fourth sub-targets are arranged on opposite sides of the first and second sub-targets, wherein left sides of the first and second sub-targets are adjacent to the third sub-target, wherein right sides of the first and second sub-targets are adjacent to the fourth sub-target,
wherein each sub-target comprises an overlay grating with a top layer and a bottom layer with different pitches, and
wherein the target comprises a continuous variation of bias values across each sub-target.

9. The patterning device of claim 8, wherein:
features in a top layer of the first sub-target are arranged with a first pitch;
features in a bottom layer of the first sub-target are arranged with a second pitch; and
the first pitch is larger than the second pitch.

10. The patterning device of claim 8, wherein:
features in a top layer of the second sub-target are arranged with a first pitch;
features in a bottom layer of the second sub-target are arranged with a second pitch; and
the first pitch is smaller than the second pitch.

11. The patterning device of claim 8, wherein the continuous variation of bias values across each sub-target is associated with an asymmetry-related property of the target.

12. The patterning device of claim 8, wherein the sub-targets in the first and second pairs have equal and opposite bias variations.

13. The patterning device of claim 8, wherein the first and second sub-targets have a same orientation that is perpendicular to an orientation of the third and fourth sub-targets.

14. The patterning device of claim 8, wherein the sub-targets of the first and second pairs are rectangular.

15. A metrology apparatus comprising:
an illumination system configured to illuminate with radiation a target formed on a substrate; and
a detection system configured to detect scattered radiation arising from illumination of the target, the target comprising:
a first pair of sub-targets comprising:
a first sub-target; and
a second sub-target; and
a second pair of sub-targets comprising:
a third sub-target; and
a fourth sub-target,
wherein the first and second sub-targets are arranged adjacent to each other vertically and the third and fourth sub-targets are arranged on opposite sides of the first and second sub-targets, wherein left sides of the first and second sub-targets are adjacent to the third sub-target, wherein right sides of the first and second sub-targets are adjacent to the fourth sub-target,
wherein each sub-target comprises an overlay grating with a top layer and a bottom layer with different pitches, and
wherein the target comprises a continuous variation of bias values across each sub-target, and
wherein the metrology apparatus is configured to:
obtain a plurality of asymmetry measurements from locations on the target;
fit the plurality of asymmetry measurements to at least one expected relationship between asymmetry and a performance parameter, based on a bias variation between the locations on the target; and
derive a measure of the performance parameter from the fitting.

16. The metrology apparatus of claim 15, wherein:
features in a top layer of the first sub-target are arranged with a first pitch;
features in a bottom layer of the first sub-target are arranged with a second pitch; and
the first pitch is larger than the second pitch.

17. The metrology apparatus of claim 15, wherein:
features in a top layer of the second sub-target are arranged with a first pitch;
features in a bottom layer of the second sub-target are arranged with a second pitch; and
the first pitch is smaller than the second pitch.

18. The metrology apparatus of claim 15, wherein the continuous variation of bias values across each sub-target is associated with an asymmetry-related property of the target.

19. The metrology apparatus of claim 15, wherein the sub-targets in the first and second pairs have equal and opposite bias variations.

20. The metrology apparatus of claim 15, wherein the first and second sub-targets have a same orientation that is perpendicular to an orientation of the third and fourth sub-targets.

* * * * *

UNITED STATES PATENT AND TRADEMARK OFFICE
CERTIFICATE OF CORRECTION

PATENT NO. : 11,385,553 B2
APPLICATION NO. : 17/306670
DATED : July 12, 2022
INVENTOR(S) : Zhou et al.

It is certified that error appears in the above-identified patent and that said Letters Patent is hereby corrected as shown below:

In the Specification

In Column 11, Line 7, delete "$A_{+d}=I_d^{+1}-I_d^{-1},$" and replace with --$A_{+d}=I_{+d}^{+1}-I_{+d}^{-1}$;--;

In Column 11, Line 7, delete "+1' and -1'" and replace with --$1^{st}$ and $-1^{st}$--;

In Column 11, Line 9, delete "+1'" and replace with --$+1^{st}$--.

Signed and Sealed this
Twenty-fifth Day of June, 2024

Katherine Kelly Vidal
*Director of the United States Patent and Trademark Office*